(12) United States Patent
Draney et al.

(10) Patent No.: US 7,064,069 B2
(45) Date of Patent: Jun. 20, 2006

(54) SUBSTRATE THINNING INCLUDING PLANARIZATION

(75) Inventors: Nathan R. Draney, Boise, ID (US); James M. Derderian, Boise, ID (US)

(73) Assignee: Micron Technology, Inc., Boise, ID (US)

(*) Notice: Subject to any disclaimer, the term of this patent is extended or adjusted under 35 U.S.C. 154(b) by 116 days.

(21) Appl. No.: 10/690,174

(22) Filed: Oct. 21, 2003

(65) Prior Publication Data
US 2005/0085050 A1    Apr. 21, 2005

(51) Int. Cl.
*H01L 21/302* (2006.01)
*H01L 21/461* (2006.01)

(52) U.S. Cl. ............... 438/690; 438/734; 438/737; 438/750

(58) Field of Classification Search ........... 438/690, 438/734, 737, 750
See application file for complete search history.

(56) References Cited

U.S. PATENT DOCUMENTS

| | | | |
|---|---|---|---|
| 5,164,815 A | 11/1992 | Lim | 257/666 |
| 5,313,102 A | 5/1994 | Lim et al. | 257/787 |
| 5,476,566 A | 12/1995 | Cavasin | 156/249 |
| 5,583,372 A | 12/1996 | King et al. | 257/676 |
| 6,027,659 A | 2/2000 | Billett | 216/11 X |
| 6,184,064 B1 | 2/2001 | Jiang et al. | 433/113 |
| 6,235,387 B1* | 5/2001 | Bennett et al. | 428/355 AC |
| 6,245,677 B1 | 6/2001 | Haq | 438/698 |
| 6,258,198 B1 | 7/2001 | Saito et al. | 156/229 |
| 6,279,976 B1 | 8/2001 | Ball | 294/64.1 |
| 6,403,449 B1 | 6/2002 | Ball | 438/460 |
| 6,472,750 B1* | 10/2002 | Sonego et al. | 257/758 |
| 6,506,681 B1 | 1/2003 | Grigg et al. | 438/692 |
| 6,534,419 B1 | 3/2003 | Ong | 438/759 |
| 6,727,184 B1* | 4/2004 | Wang et al. | 438/712 |
| 2003/0096507 A1* | 5/2003 | Baker et al. | 438/778 |
| 2004/0029041 A1* | 2/2004 | Shih et al. | 430/271.1 |
| 2004/0110010 A1* | 6/2004 | Buchwalter et al. | 428/413 |

FOREIGN PATENT DOCUMENTS

JP    359104523    * 6/1984

OTHER PUBLICATIONS

Stanley Wolf Ph.D. and Richard N. Tauber Ph.D. in Silicon Processing for the VLSI Era, vol. 1: Process Technology, Lattice Press, 1986, pp. 238-239.*

* cited by examiner

*Primary Examiner*—William M. Brewster
(74) *Attorney, Agent, or Firm*—TraskBritt

(57) ABSTRACT

A method and intermediate structure for improving the thinning and planarity of a wafer back side utilizing planarization material applied to the back side prior to at least one portion of the thinning operation and which is subsequently removed concurrently with the wafer material by one or more suitable thinning or planarization techniques. The planarization material may be applied as a thin layer or film of a hardenable material to the rough, bare back side of a wafer to produce a planar surface when hardened. The planarization material is selected to exhibit a material removal rate approximating the removal rate of the wafer material for a given removal technique such as etching, mechanical abrasion or chemical-mechanical planarization (CMP). This approach to wafer thinning and planarization results in improved process control in the form of uniform material removal rates, reduction in wafer warpage, final surface smoothness and planarity, and even distribution of residual stresses.

26 Claims, 4 Drawing Sheets

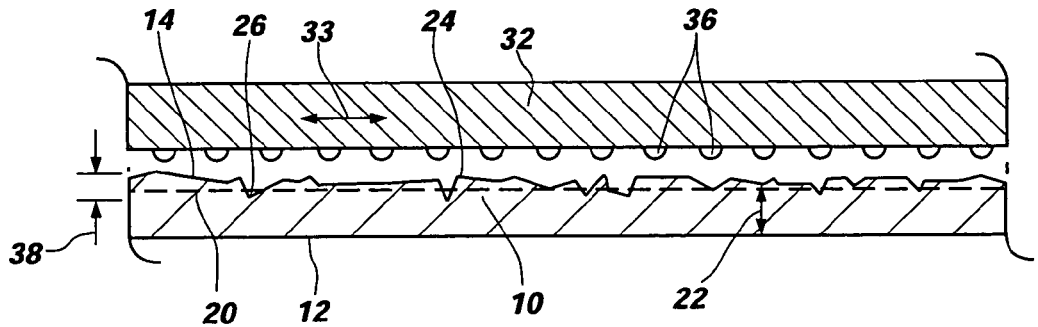
FIG. 4
*(PRIOR ART)*
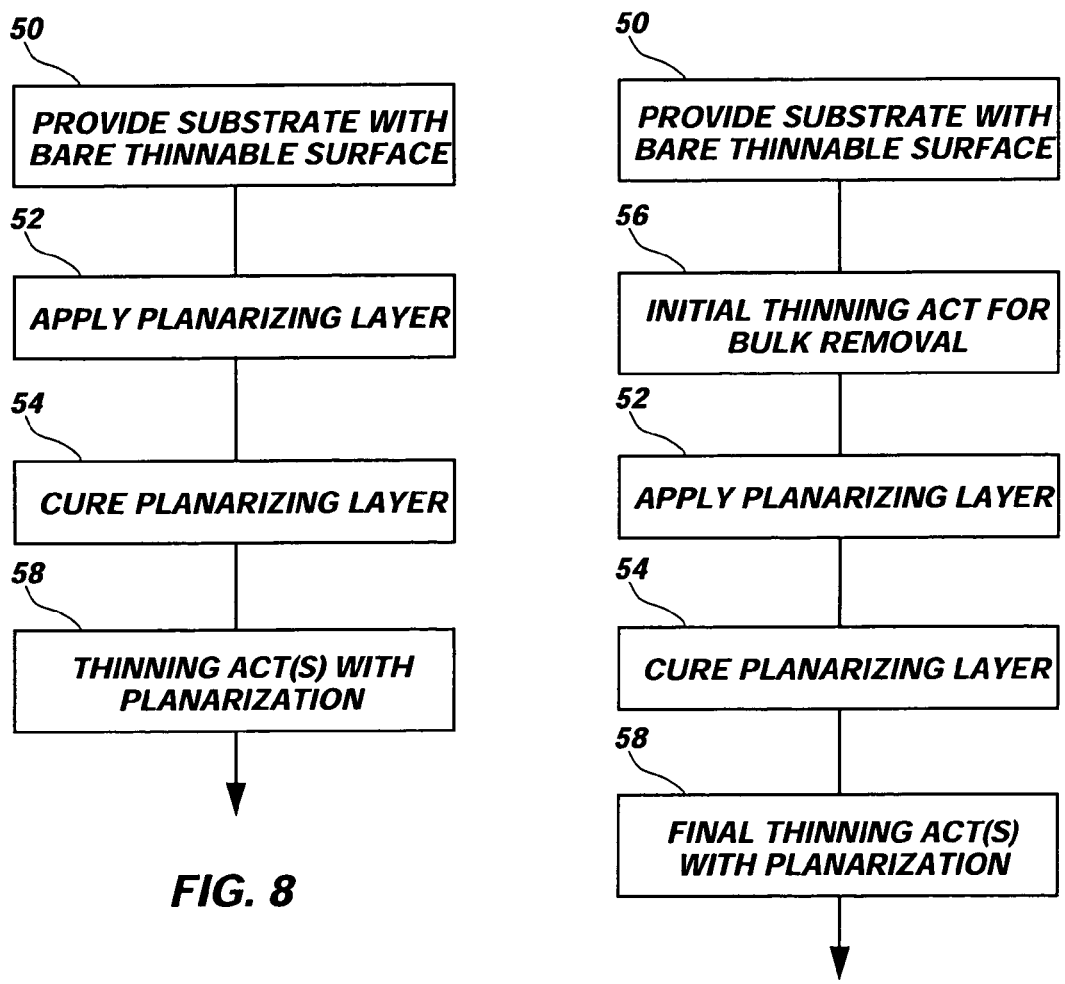
FIG. 8
FIG. 9

SUBSTRATE THINNING INCLUDING PLANARIZATION

BACKGROUND OF THE INVENTION

1. Field of the Invention

The present invention relates generally to processes and methods for fabricating electronic devices from semiconductor materials. More particularly, the present invention pertains to methods and apparatus offering improved process control for fabricating electronic devices having substrates of reduced thickness and enhanced quality.

2. State of the Art

The manufacture of semiconductor devices, commonly termed "dice" or "chips," encompasses a plurality of major manufacturing stages, each of which typically comprises a number of elements. In general, chip manufacture may be generalized as comprising the stages of crystal growth, wafer preparation, wafer fabrication, wafer sort, and packaging. Wafer sort and packaging may be performed in a different order, or combined into a single manufacturing stage. Typically, a wafer of a semiconductor material such as silicon is cut from a large crystal and may have a nominal diameter of up to about 300 mm (12 inches). Although larger bulk semiconductor substrates may have been fabricated, the 300 mm wafer is the largest-size wafer currently being phased into commercial production runs by various semiconductor device manufacturers. As cut from a cylinder of semiconductor material transverse to the longitudinal axis thereof, a wafer typically has a thickness considerably greater than the usual end product of the semiconductor fabrication, i.e., singulated semiconductor dice. While a designated active surface of a wafer is repeatedly planarized following applications of various material layers during the fabrication of integrated circuitry thereon, the back side surface is generally left relatively rough, requiring a bulk material removal operation to remove extraneous material to thin the wafer and, optionally, a planarization step to reduce the roughness of the back side surface. For example, a wafer having an initial thickness prior to fabrication of integrated circuitry thereon of about 28 mils may be thinned to a final thickness of about 4 mils.

The fabrication stage of IC production is concentrated on the "active" surface of the wafer, which is relatively planar. Electrical components such as transistors, resistors, capacitors and the like; as well as interconnecting conductors, i.e., metallization; are formed on the active surface during the wafer fabrication stage. On the other hand, the role of the back side surface of the wafer, if any, is typically that of a mounting surface used to attach an individual semiconductor die to a carrier substrate of some sort. For example, the back side of a semiconductor die may be attached to a lead frame paddle, to an interposer, to a circuit board, to another die, or to some other substrate. In other instances, such as in the case of leads-over-chip packaging or in certain chip-scale packaging configurations, the back side of a semiconductor die may be encapsulated or merely coated. However, as package sizes have decreased, reduction in die (and thus wafer) thickness has been emphasized to reduce the thickness of the resulting packaged electronic device. Wafer thinning and planarization of the back side are required to reduce the wafer thickness to a desired dimension and provide a desired surface smoothness. The continual goal of producing integrated circuits of greater density (memory or logic components per unit volume) necessitates that semiconductor dice be of minimal thickness while retaining sufficient resistance to breakage, warping, electrical degradation and dislocation formation. It is anticipated that reducing wafer thickness to the range of 2 mils or less will become commercially feasible in the near future.

Current methods of removing material from a surface of a semiconductor substrate include wet etching using a liquid etchant, dry etching using a dry etchant, sputter-etching to physically remove material, mechanical abrasion or polishing by surface grinding using an abrasive grinding element in the form of a wheel or pad in combination with an abrasive slurry, chemical-mechanical planarization (CMP) by pad buffing in the presence of abrasive particles and an etchant and, of course, sequential combinations of the above individual techniques.

There are various methods of planarization. Planarization of a semiconductor substrate active surface to a smooth plane may be effected by forming a layer of material and removing same by one or more thinning processes. For example, continuous or discontinuous formation of a layer of silicon dioxide on a silicon surface and removal thereof may be repeated until a smooth, planar surface of silicon is produced. Planarization may also be achieved by tailoring one or more of the thinning methods to form a final, smooth, planar surface.

When conventional material removal techniques, such as those referenced above are applied to the thinning and planarization of a wafer back side, deficiencies are exhibited due to the initial roughness and nonplanarity of the back side surface produced when the wafer is severed from the cylinder of semiconductor material. Chemical thinning processes, e.g., wet etches and dry etches, remove substrate material at substantially the same rate in a direction normal to the surface, whether the surface portion in question is on a "peak" or in a "valley." Thus, the finally thinned surface will have a generally similar topography but with reduced amplitude. In this application, "amplitude" is defined as the vertical distance between the point of greatest penetration from a mean surface level and the point of greatest elevation above the mean surface level.

In the case of a physical thinning process, e.g., abrasive grinding, it has been found that the lateral abrasive forces impinging upon the sides of "peaks" and "valleys" cause fracture and breakage below the valley levels. High-asperity-induced particles are produced, leading to further non-uniformities in removal rate. In addition, backgrinding wafers using conventional diamond grinding wheels may exacerbate the occurrence of flaws in the back side of a wafer.

It is desirable that the back side surface of the substrate be carefully thinned in a planar manner thereacross, particularly when nearing the end point of the thinning operation wherein a final substrate thickness is reached. However, localized stresses may cause wafer cracking, breakage, warpage and the like, particularly in the case of a very thin substrate. The thinning process is complicated by any warpage of the wafer occurring responsive to internal substrate stresses as the wafer is thinned. Such warpage may cause nonplanarity of the back side surface as thinning continues and is difficult to compensate for. As wafers are thinned to an ever-greater extent, the tendency to warp is exacerbated as stresses induced by fabrication of the integrated circuitry on the active surface of the wafer become more significant.

Various methods are known which are suitable for applying a layer of polymeric or other material to a substrate surface, such as a wafer active surface. A nonexhaustive list of such processes includes screen-coating, stencil-coating, spin-coating, chemical vapor deposition (CVD), plasma-enhanced chemical vapor deposition (PECVD), and the like. In the so-called Parylene™ process, a dimer molecule is heated to form a monomer vapor, which then deposits on a surface as a polymer at low (ambient) temperature.

The thinning and planarizing of the back side of a semiconductor wafer and the like by conventional techniques leaves much to be desired, in as much as such techniques fail to uniformly produce the desired planarity and smoothness. Improved methods for thinning and planarizing the back sides of semiconductor wafers and other substrates would be desirable from the standpoint of improved process control and quality enhancement in the final product.

BRIEF SUMMARY OF THE INVENTION

The present invention comprises a method for thinning and planarization of the back side of semiconductor substrates, such as semiconductor wafers. In these methods, a layer or film of highly penetrating hardenable material, hereinafter termed a "planarizing material" or a "second material" for the sake of convenience, is applied to the back side of a semiconductor substrate of a first material, for example, in the form of a semiconductor wafer, to fill in valleys or "vugs" in the surface and provide a level, planar surface for subsequent thinning. The planarizing material used to coat the surface prior to thinning is selected to exhibit characteristics, when hardened, similar to those of the underlying substrate material in the exhibited rate of material removal for the particular thinning method used. Thus, for an etch-thinning method, the etch rate of the planarizing material is selected to be the same as or similar to that of the semiconductor material of the substrate. When the thinning method is mechanical abrasion (e.g., grinding, polishing), the selected planarizing material (when hardened) will exhibit the same or similar rate of solids removal as that of the semiconductor material of the substrate.

The planarizing material may comprise, for example, a polymer of any of the groups of epoxies or acrylics or, more particularly, thermal or ultraviolet (UV) cross-linkable polymer, or a two-part epoxy. Other classes of coating which may be used include silicones, urethanes and siloxanes. The relatively coarse nature of the bare wafer back side surface prior to backgrinding or etching to remove material enhances the penetration of the coating selected. The planarizing material may be applied prior to a first, coarse or bulk thinning operation, or following an initial or intermediate thinning step but before a final thinning or planarizing operation.

The selected method for applying the planarizing material to the bare substrate surface may be any method which will produce a relatively planar, exposed surface. For example, the coating method may comprise screen-coating, stencil-coating, or spin-coating of a flowable material. Alternatively, the planarizing material may be formed as a solid element which may be laminated to the substrate surface and subsequently bonding thereto. The planarizing material may be in the form of a tape or film element which is applied to the substrate, heated to a flowable state to provide a planar surface, and cooled to a solid state. Other methods include CVD or PECVD. A Parylene™ deposition process may also be used in which a dimer is vaporized to a monomer. When exposed at lower temperatures to a surface, a tenacious polymer is deposited on the surface. An exemplary dimer used in the Parylene™ process is di-para-xylene.

The thinning method may comprise, for example, chemical etching, mechanical (abrasive) planarization, CMP, or grinding, followed by wet or dry chemical etching. The back side of a wafer or die may be coated with the planarizing material at any point prior to a final planarization step.

Although the present invention is primarily exemplified herein as applying to structures such as wafers formed of semiconductor materials, the term "substrate" as used herein includes other structures which have a surface requiring, or benefiting from, thinning and planarization including, without limitation, ceramic, glass and quartz substrates.

Where the substrate comprises a semiconductor material such as silicon, the bare surface may be exposed to an oxidizing atmosphere before applying the planarization material. The adhesion of many polymeric materials to silicon dioxide is much better than their adhesion to silicon.

The advantages of the present invention include, without limitation, providing a uniform wet or dry etching rate to form a planar surface on the thinned substrate, providing a uniform grinding rate to form a planar surface on the thinned substrate, minimized production of high-asperity-induced particles upon grinding, inducing uniform stress distribution on the substrate surface during grinding with associated minimization of regions of high micro-stresses and the use of well-developed, conventional material deposition processes in combination with conventional material removal processes for substrate thinning and planarization according to the invention.

Other features and advantages of the present invention will become apparent to those of ordinary skill in the art through consideration of the ensuing description, the accompanying drawings, and the appended claims.

BRIEF DESCRIPTION OF THE DRAWINGS

In the drawings, which depict exemplary embodiments of various features of the present invention:

FIG. 4 is a cross-sectional inverted side view of a portion of a semiconductor wafer showing a wafer back side polished to a final wafer thickness by abrasive planarization or CMP of the prior art;

FIG. 8 is a flow sheet showing the general acts in a method for thinning and planarizing a substrate of one embodiment of the invention;

FIG. 9 is a flow sheet showing the general acts in a method for thinning and planarizing a substrate of another embodiment of the invention.

DETAILED DESCRIPTION OF THE INVENTION

Figure 1:
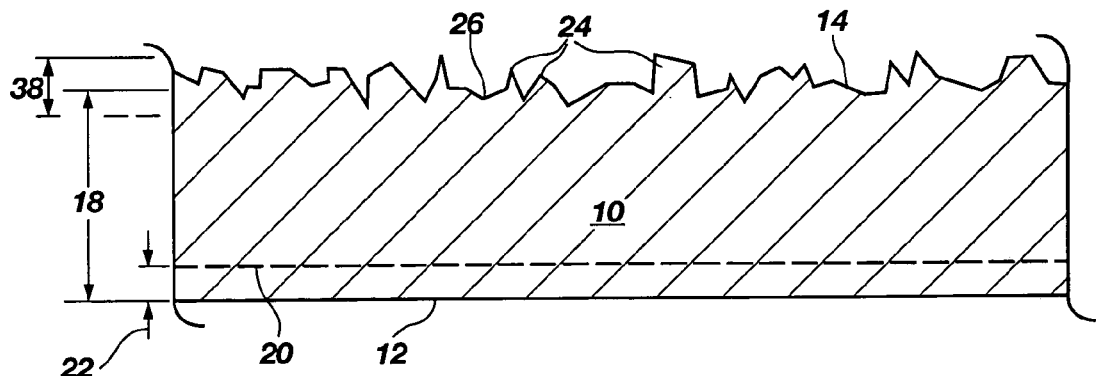
FIG. 1 is a cross-sectional inverted side view of a portion of a semiconductor wafer of the prior art following wafer preparation.

The prior art approach to thin a substrate such as a multidie semiconductor wafer 10, from an initial mean thickness 18 of, e.g., about 28 mm to a final mean thickness 22 of about, e.g., 4 mm is illustrated in FIGS. 1, 2, 3, 4 and 4A. The bare back side surface 14 is typically rough, as shown by the exaggerated "peaks" 24 and "valleys" 26 which define the topography of the surface in FIG. 1. The roughness may be measured in terms of a maximum amplitude 38 between the deepest valley 26 and the highest peak 24. The final mean thickness 22 of semiconductor wafer 10 is shown as the distance between an active surface 12 and a final back side surface 20. It is very desirable that the back side surface 14 be as uniformly planar and smooth as possible to enable accurate and uniform severance or singulation of individual semiconductor dice cut from the semiconductor wafer 10, to maintain the structural integrity of the resulting dice and to maintain uniform thickness dimensions thereof for packaging.

Various methods are used conventionally for bulk thinning by so-called "backgrinding" of a multidie semiconductor wafer 10, including mechanical methods of grinding, etching with a dry or wet chemical (or even a vapor), and combinations thereof. One currently preferred method is to initially use one of a mechanical, i.e., abrasive polishing, CMP, or grinding process, followed by a wet chemical etch or a dry chemical etch.

Figure 2:
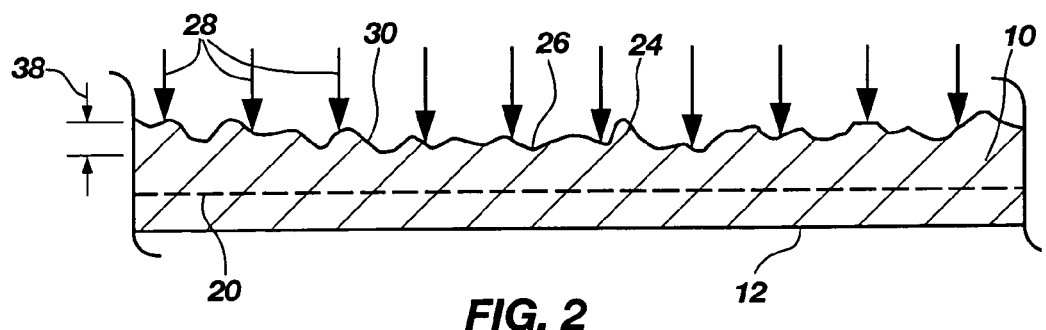
FIG. 2 is a cross-sectional inverted side view of a portion of a semiconductor wafer following partial chemical etch planarization of the wafer back side by a conventional wet or dry chemical process of the prior art.

As shown in FIG. 2, the etching of a bare substrate (semiconductor wafer 10) surface such as a rough wafer back side surface 14, reduces the topographic maximum amplitude 38 but does not planarize the etched surface 30 to a high degree due to the isotropic nature of the etch chemistry. An isotropic etchant 28 may be considered as attacking all exposed surfaces of the peaks and valleys 24, 26 at substantially the same rate in a direction normal to the particular surface location.

Figure 3:
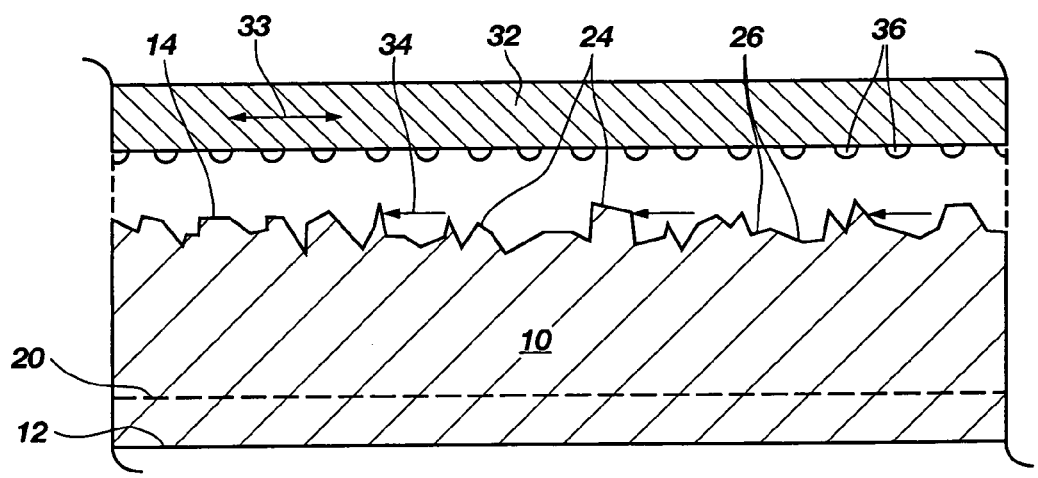
FIG. 3 is a cross-sectional inverted side view of a portion of a semiconductor wafer illustrating planarization of the wafer back side by mechanical grinding of the prior art.

FIG. 3 depicts a movable element 32 which is moved in a lateral direction 33, such as through rotation. The movable element 32, which may be structured as a pad, carries abrasive materials 36 exposed beyond the pad surface and which impinge laterally with force against nonhorizontal back side surface 14, i.e., as directed lateral forces 34. A similar effect results from use of a diamond grinding wheel. The directed lateral forces 34 tend to break the peaks 24 along various crystalline cleavage planes with a resulting, significant degree of nonuniformity in the surface topography, although the amplitude will be reduced. The production of high-asperity particles from the grinding process will also be significant, leading to nonuniform solids removal.

Figure 4A:
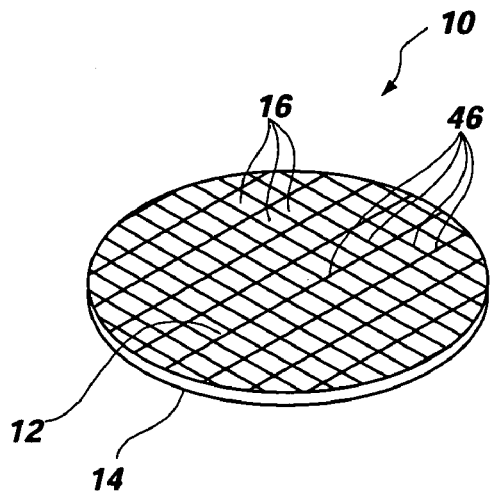
FIG. 4A is an isometric upper view of a prior art multidie semiconductor wafer.

As shown in FIG. 4, when the back side surface 14 of a semiconductor wafer 10 has been ground to a desired final mean thickness 22, the surface nevertheless remains undesirably rough. The valleys 26 may extend into the semiconductor wafer 10 to produce weakness therein, or even cracking or fracture. This is especially critical in very thin wafers, e.g., 2–4 mm final mean thickness 22, which are also subject to warpage. Thus, in the prior art, conventional methods may lead to failure of semiconductor dice 16 (see FIG. 4A) at the time of or following singulation from the semiconductor wafer 10, i.e., by cutting along streets 46.

Turning now to FIGS. 5 through 10, exemplary embodiments of methods of the invention are illustrated for thinning and planarizing a substrate, such as a semiconductor wafer 10 having back side surface 14. The semiconductor wafer 10 may comprise a wafer of silicon, gallium arsenide, germanium or indium phosphide, by way of example only.

Figure 5:
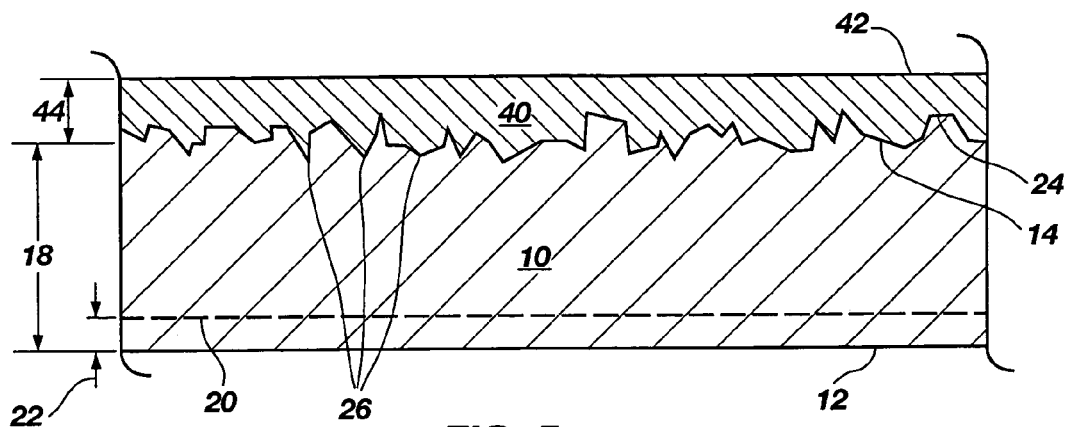
FIG. 5 is a cross-sectional inverted side view of a portion of a semiconductor wafer prepared for back side thinning and planarization by a method of the present invention.

In FIG. 5, a semiconductor wafer 10 is shown with an active surface 12 and rough back side surface 14. A planarizing material 40 has been deposited as an overlying layer on the original nonplanar back side surface 14 and is shown as filling in the valleys 26 and covering the peaks 24 of the surface. In other words, the layer of planarizing material 40 substantially covers all features of the topography and, desirably, covers the entire back side surface 14. The layer of planarizing material 40 is formed and cured to have a substantially planar exposed surface 42, and is shown with a mean thickness 44. The layer of planarizing material 40 and a substantial portion of the underlying substrate (semiconductor wafer 10) are to be removed, thinning the substrate to a final back side surface 20 which is substantially planarized.

The layer of planarizing material 40 penetrates the rough surface of back side surface 14 and is very adherent thereto. The planarizing material may be desirably chosen to meet the following criteria:

(a) it is easily applied to a surface of the substrate on which thinning is to be initiated;

(b) when hardened, it exhibits a solids removal rate similar to that exhibited by the underlying substrate material, e.g., semiconductor material, when subjected to the same material removal technique; and (c) when hardened, it forms a substantially planar, exposed surface.

Materials which may be used to form the layer of planarizing material 40 of the above-listed criteria include various polymers which are in the classes of epoxies and acrylics and, more particularly, thermal (thermoset) or ultraviolet light (UV) linkable polymers and two-part epoxy formulations. Other general classes of coating which are contemplated as usable in this invention include silicones, urethanes, and siloxanes, without limitation thereto. A number of photoresists will etch at substantially the same rate as silicon materials, such as, for example, silicon dioxide. As disclosed below, it may be desirable to oxidize back side surface 14, forming silicon dioxide in the case of a silicon wafer, prior to application of the planarizing material 40. Of course, the etch rates for planarizing material 40 may be matched empirically to that of the material of the wafer for each selected etchant.

The application of a layer of planarizing material 40 to a substrate back side surface 14 may be by a variety of methods. In one method for example, a flowable polymeric material (liquid or particulate solid) maybe applied to a back side surface 14 by screen-coating or stencil-coating. If a liquid material is used, spin-coating is also effective. The polymeric material may then be cured to a hardened state by application of heat or, in some instances, by a selected wavelength of radiation. In another variation, an epoxy material can be cured to a so-called "B" stage of tackiness, at which it is still flowable. The epoxy material may then be applied to the back side surface 14 and reheated to complete the cure, bond to the surface and harden. It is contemplated that a layer of epoxy material may be applied to a backing sheet carrying a release layer, cured to a "B" stage and applied to the back side surface 14. The backing may then be stripped off, and the epoxy cure and hardening completed.

Other application methods which may be used include CVD and PECVD, in which the planarizing material is applied as a vapor. These depositon methods are well known in the art.

In a deposition method of newer development, the Parylene Process™ may be used. In this method, an organic dimer is heated to form monomers and then applied at a lower temperature to a back side surface 14 where it deposits as a planarizing material 40. A dimer such as di-para-xylene may be used.

Another deposition method which may be used comprises the formation of a tape or film element of partially polymerized material. The tape or film may then be applied to the back side surface 14, heated to flow, bond to the surface, level and planarize, and finally cooled to a solid state.

Figure 6:
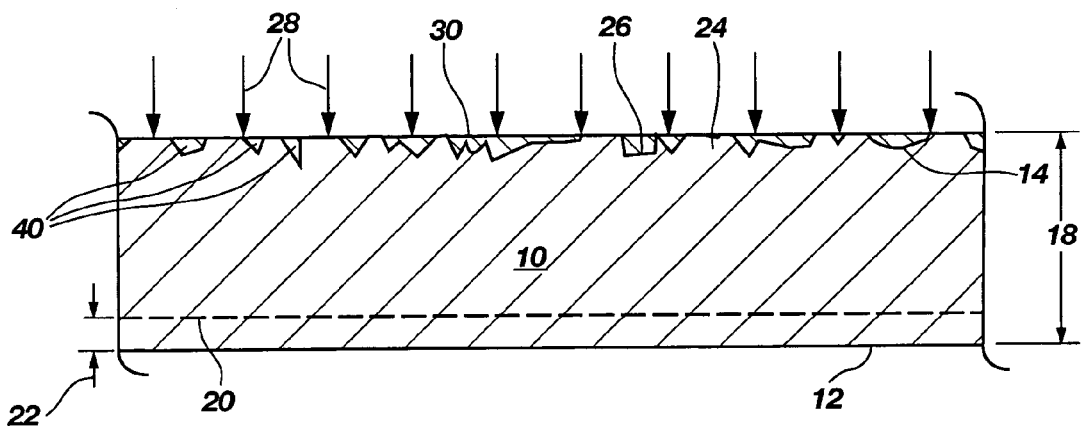
FIG. 6 is a cross-sectional inverted side view of a portion of a semiconductor wafer with a back side prepared by a method of the invention and partially thinned and planarized by a chemical etching process.

FIG. 6 shows the substrate (semiconductor wafer 10) of FIG. 5 following exemplary thinning by wet or dry chemical etching by isotropic etchant 28 to produce an etched surface 30 near the original back side surface 14. Unlike the rough original back side surface 14, the etched surface 30 is substantially planar and includes etched portions of the planarizing material 40. The exposure to isotropic etchant 28 may be continued until the desired final back side surface 20, i.e., final mean thickness 22, is reached. Inasmuch as the planar exposed surface 42 initially exposed to the isoctropic etchant 28 is substantially planar, the attained final back side surface 20 will also be substantially planar. While dry etching, for example, reactive ion etching (also termed "plasma etching"), may be used to thin a substrate, it is currently preferred that wet etching be employed. Suitable etchants for a silicon substrate include, without limitation, 100% KOH, KOH mixed with deionized water, KOH mixed with isopropyl alcohol, a mixture of HF, $HNO_3$ and $CH_3COOH$ formulated, for example as so-called "95% poly etch," comprising 50% nitric acid, 2.5% acetic acid and 0.74% hydrofluoric acid, by volume.

Figure 7:
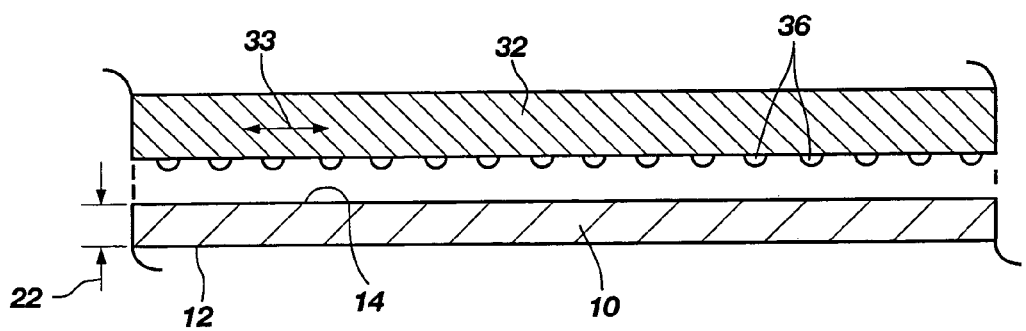
FIG. 7 is a cross-sectional inverted side view of a portion of a semiconductor wafer with a back side prepared by a method of the invention and thinned and planarized by mechanical grinding or abrasion or CMP to a smooth, planar surface.

However, a mechanical or chemical-mechanical material removal process may be used to thin the back side surface 14. As shown in FIG. 7, a movable element 32 with attached abrasive materials 36 may be used to grind a substrate (semiconductor wafer 10) to (or nearly to) a desired final mean thickness 22. The movable element 32 may be moved in a lateral direction or lateral directions 33 parallel to the desired final back side surface 20 to remove substrate material until surfaces 14 and 20 merge.

The acts of the methods of the present invention may be conducted in differing orders. As shown in FIG. 8 with respect to one exemplary embodiment, a substrate is provided in act 50 with a bare, thinnable back side surface 14. The term "bare" denotes that electronic or other components are not present on the back side surface 14. A layer of planarizing material 40 is then applied, as discussed above, in act 52. Following hardening in act 54, one or more thinning and planarizing acts 58 may be used to thin and complete planarization. The thinning and planarization acts 58 may be of any of the previously mentioned techniques.

As shown in FIG. 9 with respect to another exemplary embodiment, the method of FIG. 8 may be modified to include an initial thinning act 56 for bulk removal of substrate material prior to deposition of a planarizing material in act 52.

Figure 10:
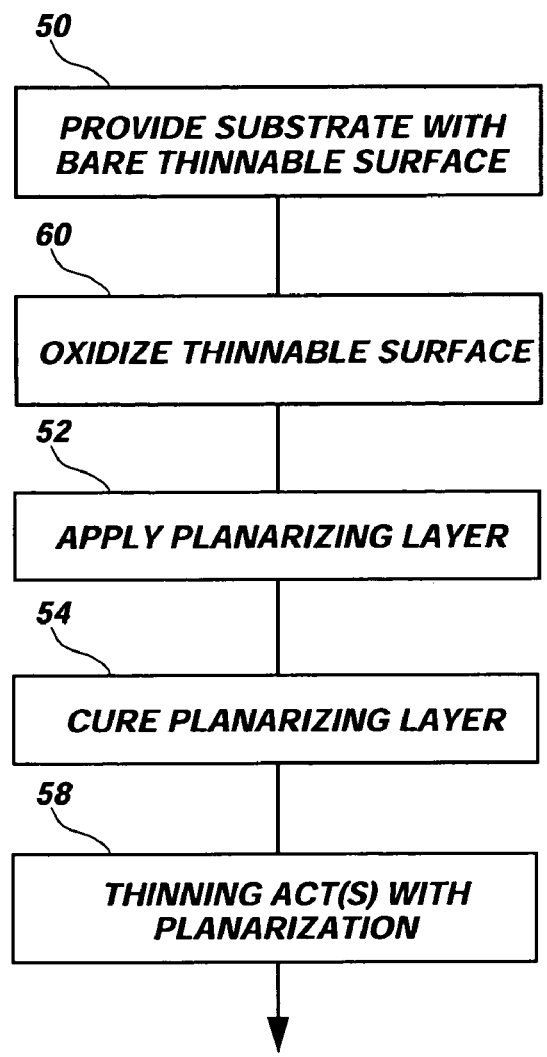
FIG. 10 is a flow sheet showing the general acts in a method for thinning and planarizing a substrate of a further embodiment of the invention.

FIG. 10 illustrates another exemplary embodiment of a method of the present invention. In this embodiment, the thinnable back side surface 14 is first subjected to an oxidation act 60. When the substrate is silicon, for example, the back side surface 14 may be oxidized to silicon dioxide. Polymers such as are used as planarizing materials in this invention are, in general, much more adherent to the oxide than to silicon itself. However, it should be noted that, in general, the initially rough back side surface 14 may enhance adhesion of such a polymer thereto and render preoxidation in act 60 unnecessary.

As practiced by those of ordinary skill in the art, the material removal process from a substrate such as a semiconductor wafer is typically practiced while the active surface of the wafer is protected from possible mechanical damage and reagent and debris contamination, for example, by the prior application of so-called "backgrind tape" as known in the art. Further, the manner in which a substrate such as a wafer is fixed for material removal therefrom is also well known. Accordingly, no further description of the acts preliminary to the material removal processes described herein, including mounting of the wafer or other substrate, is provided.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Moreover, features from different embodiments of the invention may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A method for processing a substrate, comprising:
   providing a substrate of a first material having a bare, relatively rough surface topography comprising peaks and valleys;
   applying a layer of a second material to the bare surface of sufficient depth to cover the peaks, fill the valleys and provide an exposed, substantially planar surface of the second material of lesser roughness than the bare surface and thereover;
   bonding the layer of the second material to the bare surface to provide an exposed, planar surface of the second material of substantially lesser roughness than the bare surface and extending thereover;
   removing the first material and the second material from the substrate from a side thereof proximate the bare surface by removing the second material covering the peaks until the second material and the first material comprising the peaks are concurrently exposed; and
   thereafter removing the first material and the second material at substantially equal rates.

2. The method of claim 1, wherein removing the first material and the second material from the substrate comprises planarizing the substrate from proximate the bare surface.

3. The method of claim 2, wherein planarizing the substrate from the bare surface further comprises substantially reducing an initial thickness of the substrate by removal of additional first material subsequent to removal of all of the second material.

4. The method of claim 1, wherein removing the first material and the second material from the substrate further comprises substantially reducing an initial thickness of the substrate by removal of additional first material subsequent to removal of all of the second material.

5. The method of claim 1, wherein providing a substrate of a first material having a bare surface comprises providing a semiconductor substrate.

6. The method of claim 5, wherein providing a semiconductor substrate comprises providing a wafer of silicon, gallium arsenide, germanium or indium phosphide.

7. The method of claim 5, wherein the bare surface comprises a back side of the semiconductor substrate.

8. The method of claim 1, further comprising oxidizing the bare surface prior to applying the layer of the second material.

9. The method of claim 1, wherein the second material comprises a polymeric material.

10. The method of claim 1, wherein the second material includes at least one of the polymer groups comprising epoxies, acrylics, silicones, urethanes, siloxanes and Parylenes™.

11. The method of claim 1, wherein the second material is a flowable material and is applied to the bare surface by one of screen-coating, stencil-coating, and spin-coating.

12. The method of claim 1, wherein the second material is at least a semisolid element and applying comprises laminating the at least a semisolid element to the bare surface.

13. The method of claim 12, wherein the at least a semisolid element comprises one of a tape and a film.

14. The method of claim 12, wherein the at least a semisolid element comprises a layer of the second material placed on a backing layer, and applying comprises applying the layer of the second material to the bare surface and removing the backing layer.

15. The method of claim 14, further comprising applying a release layer to the backing layer before placing the second material thereon, and wherein removing the backing layer comprises releasing the layer of the second material from the backing layer using the release layer.

16. The method of claim 1, wherein the second material is one of a thermoset polymer and a radiation cross-linkable polymer, and wherein the second material is applied to the bare surface in a flowable state and cured to a hardened state.

17. The method of claim 1, wherein the second material comprises an epoxy, and the epoxy is partially cured to a tacky state prior to application to the bare surface and further cured to bond to the bare surface and harden.

18. The method of claim 1, further comprising hardening the second material on the bare surface.

19. The method of claim 18, wherein hardening the second material comprises curing the second material.

20. The method of claim 1, wherein removing the first material and the second material from the substrate comprises at least one of wet etching, dry etching, grinding, abrasive planarization, and chemical-mechanical planarization.

21. The method of claim 1, further comprising removing first material from the substrate prior to applying the second material to the bare surface.

22. The method of claim 21, wherein removing first material from the substrate prior to applying the second material to the bare surface is effected by a process including mechanical abrasion of the substrate.

23. The method of claim 22, wherein removing the first material and the second material from the substrate comprises etching.

24. The method of claim 21, wherein removing the first material and the second material from the substrate comprises planarizing the substrate from proximate the bare surface.

25. The method of claim 24, wherein removing the first material and the second material from the substrate comprises etching.

26. The method of claim 21, wherein removing the first material and the second material from the substrate comprises etching.

* * * * *